US008698385B2

(12) United States Patent
Brick et al.

(10) Patent No.: US 8,698,385 B2
(45) Date of Patent: Apr. 15, 2014

(54) OPTOELECTRONIC SEMICONDUCTOR COMPONENT AND DISPLAY MEANS

(75) Inventors: Peter Brick, Regensburg (DE); Michael Wittmann, Alteglofsheim (DE); Sven Weber-Rabsilber, Neutraubling (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 212 days.

(21) Appl. No.: 13/202,252

(22) PCT Filed: Mar. 1, 2010

(86) PCT No.: PCT/EP2010/052564
§ 371 (c)(1),
(2), (4) Date: Sep. 22, 2011

(87) PCT Pub. No.: WO2010/108761
PCT Pub. Date: Sep. 30, 2010

(65) Prior Publication Data
US 2012/0001208 A1 Jan. 5, 2012

(30) Foreign Application Priority Data
Mar. 27, 2009 (DE) .......................... 10 2009 015 313

(51) Int. Cl.
*H01L 33/58* (2010.01)
*H01L 33/08* (2010.01)
(52) U.S. Cl.
USPC ...... 313/498; 362/231; 257/89; 257/E33.073; 257/E33.005
(58) Field of Classification Search
None
See application file for complete search history.

(56) References Cited

U.S. PATENT DOCUMENTS

| 6,523,976 | B1 | 2/2003 | Turnbull et al. |
| 7,066,623 | B2 | 6/2006 | Lee et al. |
| 2006/0066218 | A1 | 3/2006 | Yamaguchi et al. |
| 2007/0102718 | A1 | 5/2007 | Takekuma et al. |
| 2007/0206390 | A1 | 9/2007 | Brukilacchio et al. |
| 2007/0273984 | A1 | 11/2007 | Pao et al. |
| 2008/0084694 | A1 | 4/2008 | Rose et al. |
| 2009/0284951 | A1 | 11/2009 | Muschaweck |
| 2011/0110083 | A1 | 5/2011 | Pahlke et al. |

FOREIGN PATENT DOCUMENTS

| DE | 10 2004 057 499 A1 | 7/2005 |
| DE | 10 2006 051 769 A1 | 5/2007 |
| DE | 10 2006 046 233 A1 | 4/2008 |
| DE | 10 2006 047 233 A1 | 4/2008 |
| DE | 10 2006 050 880 A1 | 4/2008 |
| DE | 10 2008 007 723 A1 | 8/2009 |
| EP | 1 453 108 A1 | 9/2004 |
| EP | 1 641 052 A2 | 3/2006 |
| JP | 11-3051 A | 1/1999 |
| JP | 2007-080526 A | 3/2007 |
| JP | 2008123847 A | 5/2008 |
| TW | I287117 B | 9/2007 |
| TW | 200817636 A | 4/2008 |
| WO | WO 2006/103582 A1 | 10/2006 |

*Primary Examiner* — Britt D Hanley
(74) *Attorney, Agent, or Firm* — Slater & Matsil, L.L.P.

(57) ABSTRACT

In at least one embodiment, an optoelectronic semiconductor component includes at least two optoelectronic semiconductor chips, which are designed to emit electromagnetic radiation in mutually different wavelength ranges when in operation. The semiconductor chips are mounted on a mounting surface of a common carrier. Furthermore, the optoelectronic semiconductor component contains at least two non-rotationally symmetrical lens bodies, which are designed to shape the radiation into mutually different emission angles in two mutually orthogonal directions parallel to the mounting surface. One of the lens bodies is here associated with or arranged downstream of each of the semiconductor chips in an emission direction.

14 Claims, 8 Drawing Sheets

FIG 1
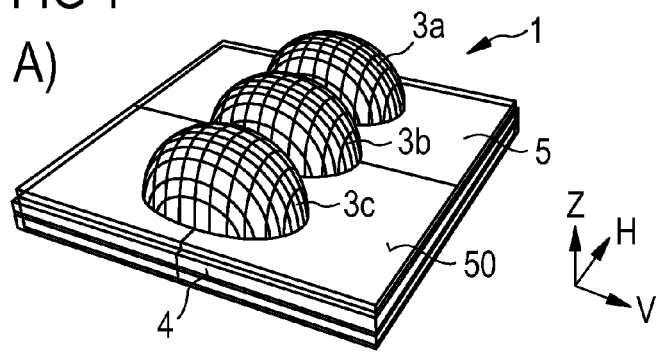
A)
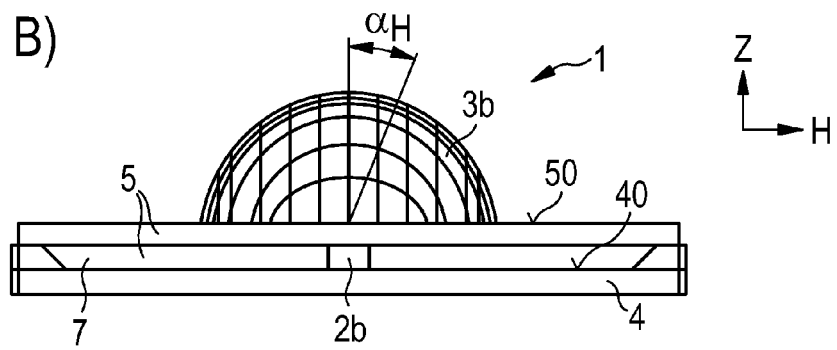
B)
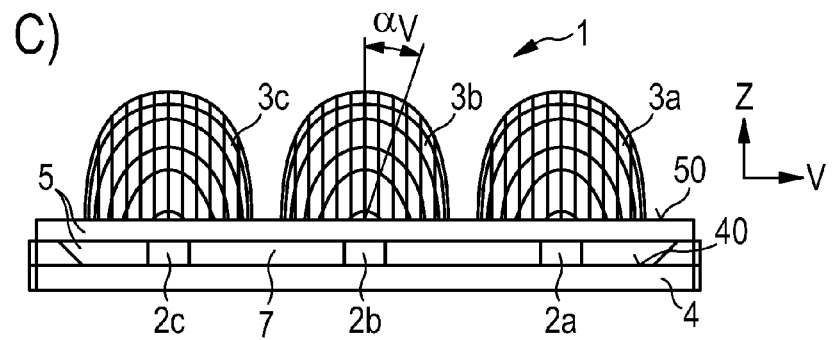
C)
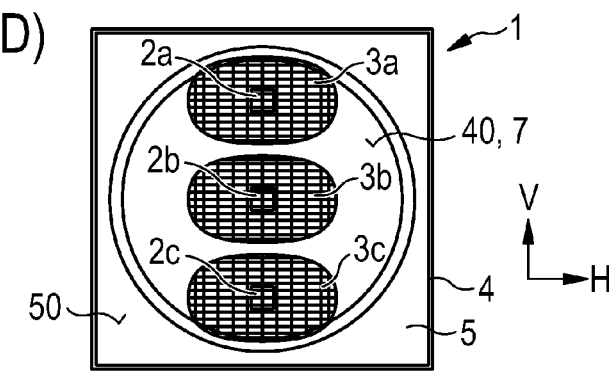
D)

FIG 2
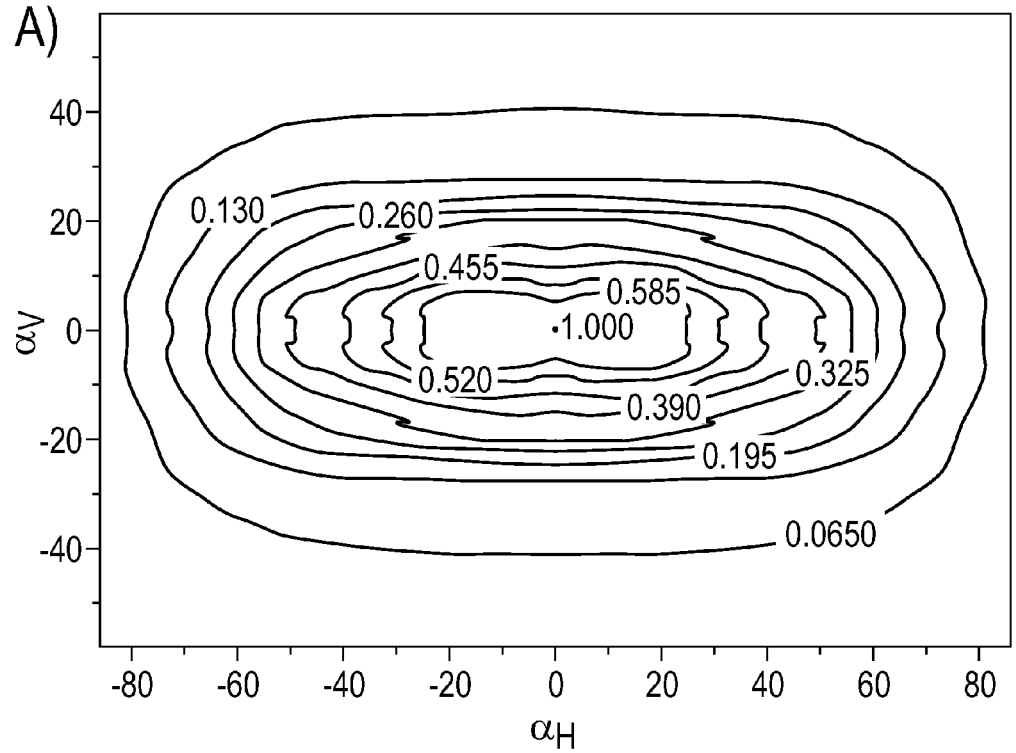
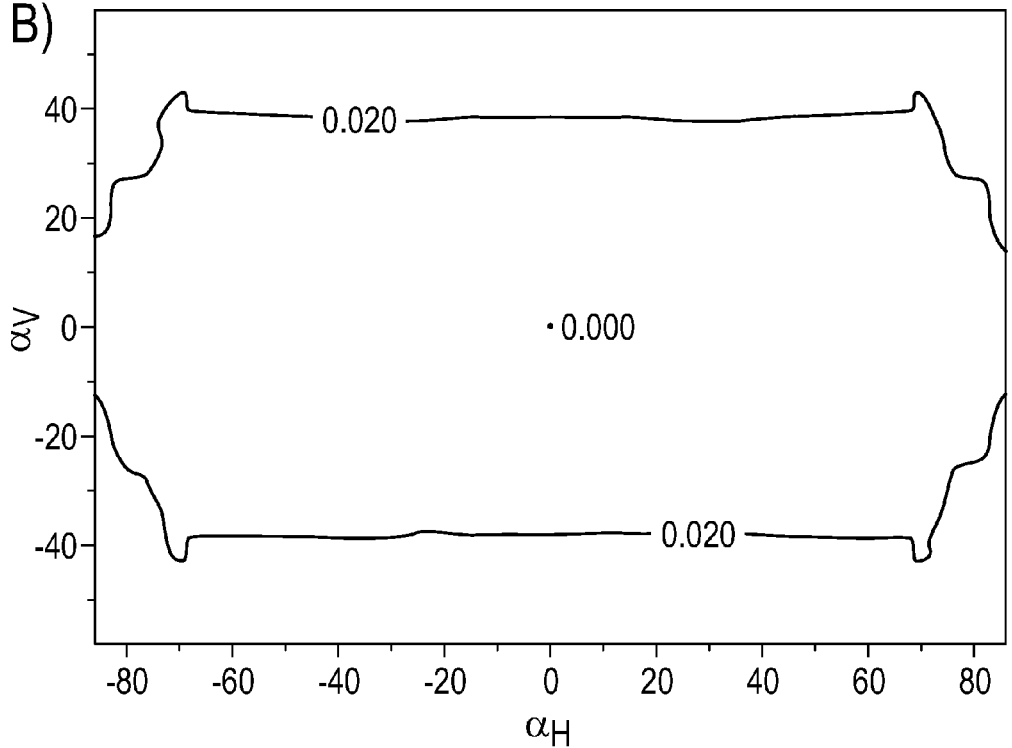

FIG 3
A)
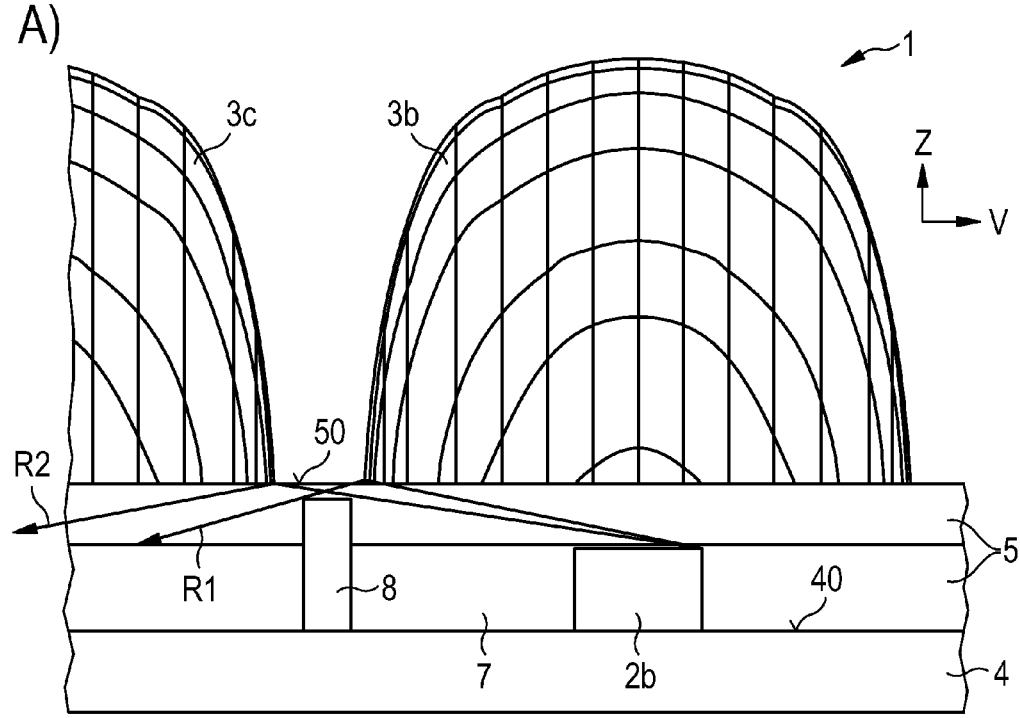
B)
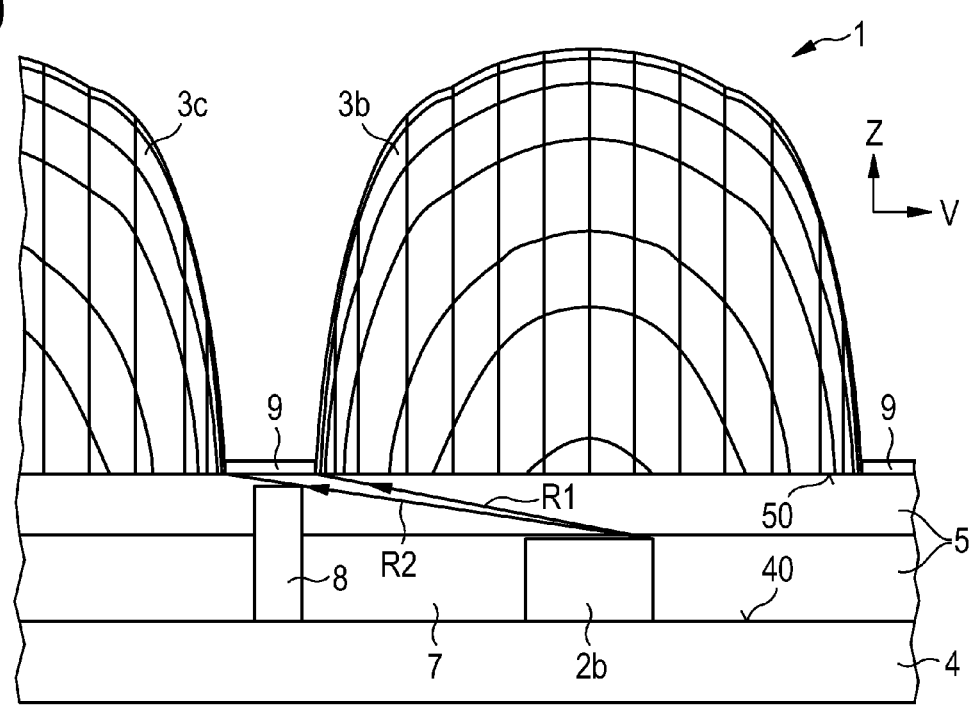

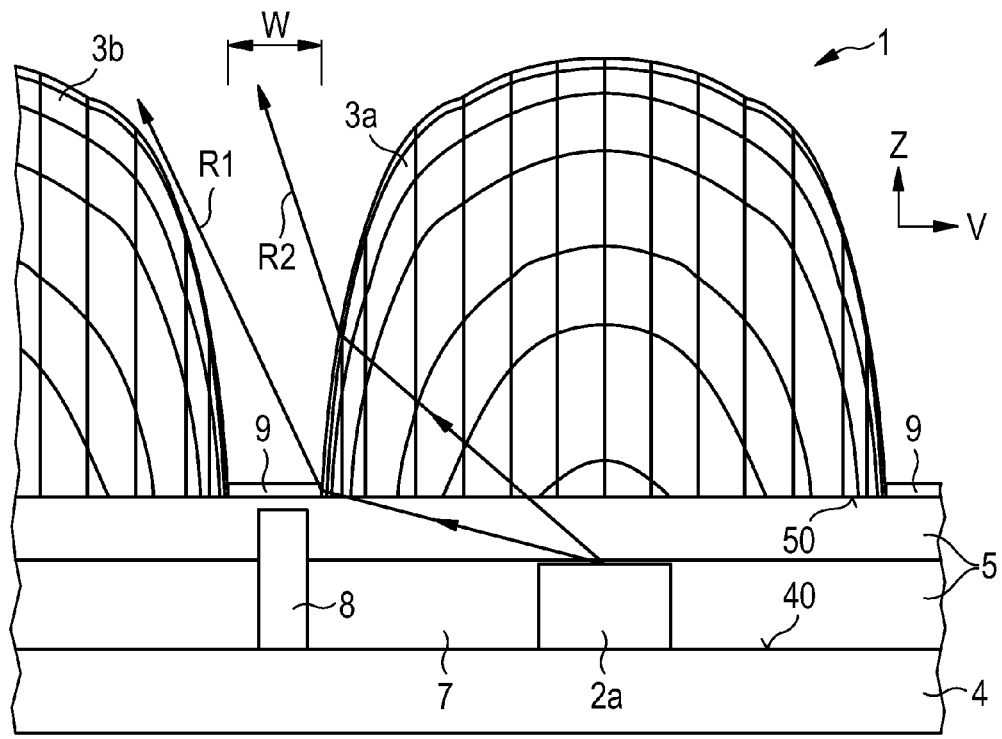
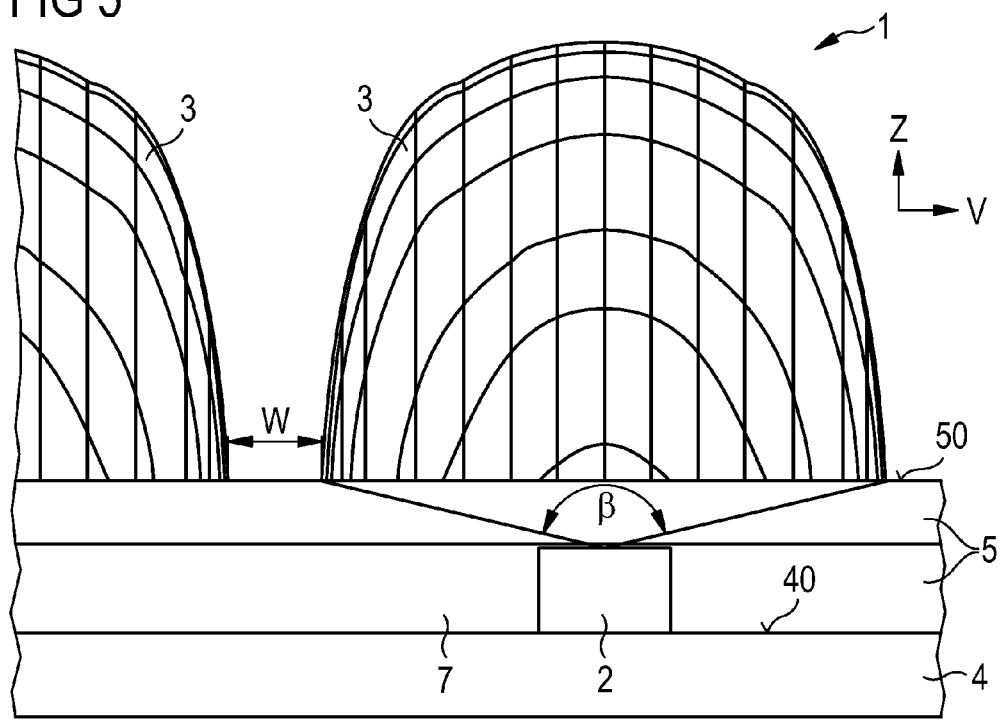

FIG 6
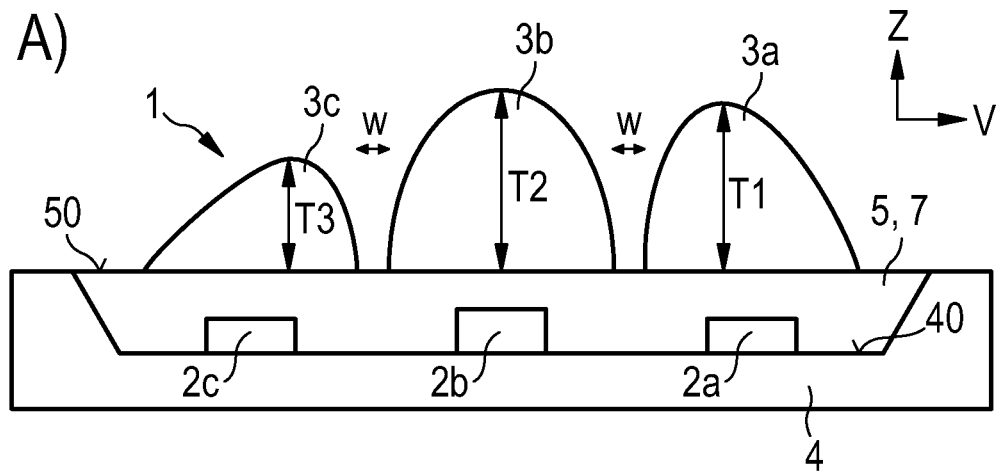
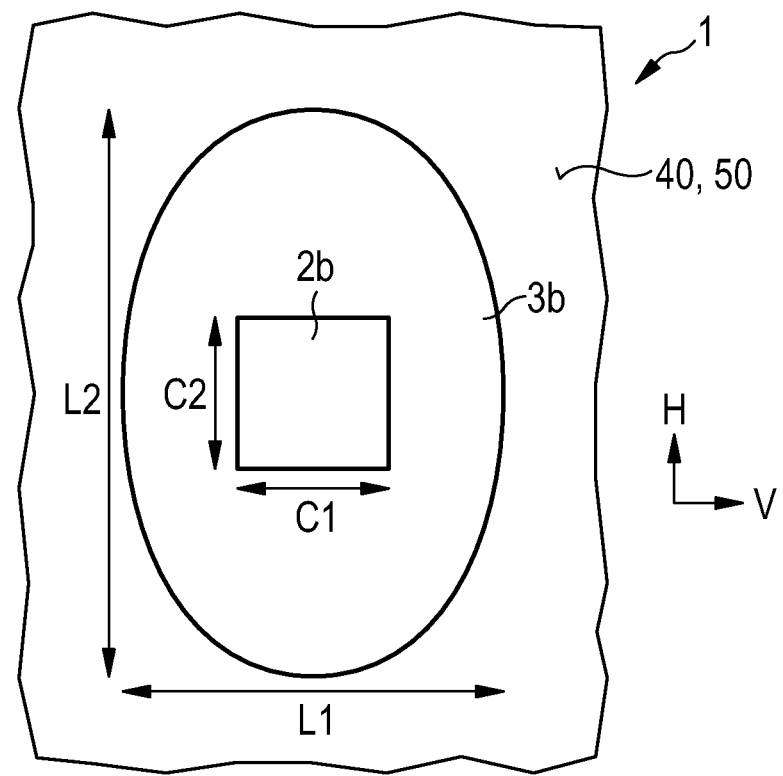

FIG 8
A)
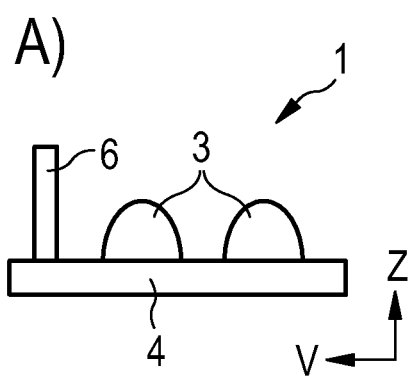
B)
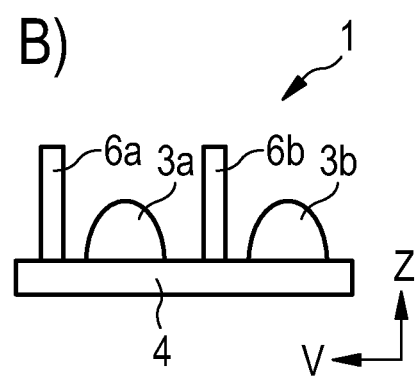
C)
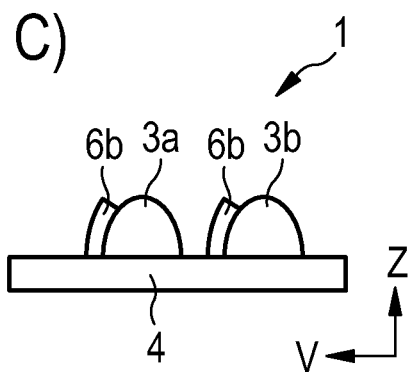
D)
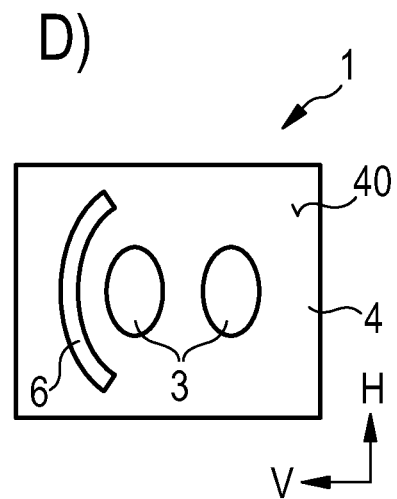

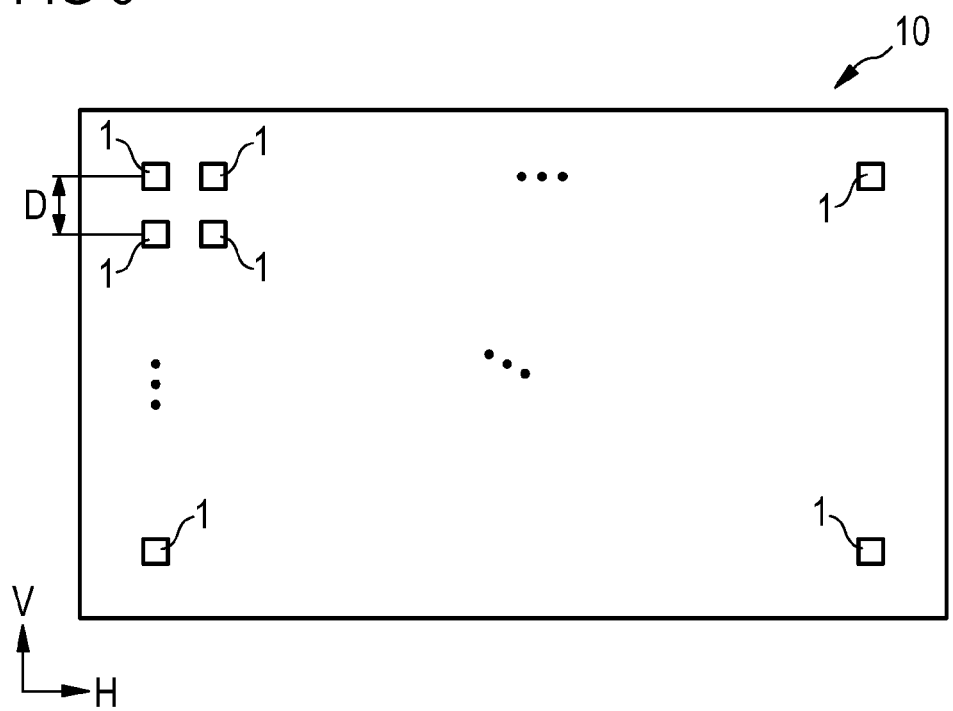

OPTOELECTRONIC SEMICONDUCTOR COMPONENT AND DISPLAY MEANS

This patent application is a national phase filing under section 371 of PCT/EP2010/052564, filed Mar. 1, 2010, which claims the priority of German patent application 10 2009 015 313.6, filed Mar. 27, 2009, each of which is incorporated herein by reference in its entirety.

TECHNICAL FIELD

An optoelectronic semiconductor component is provided. A display means with such an optoelectronic semiconductor component is additionally provided.

BACKGROUND

German patent Document DE 10 2004 057 499 A1 relates to a device for producing light.

SUMMARY OF THE INVENTION

In one embodiment, an optoelectronic semiconductor component exhibits emission characteristics which are uniform in terms of color location over a large angular range. In another embodiment, a display device includes such an optoelectronic semiconductor component.

According to at least one embodiment of the optoelectronic semiconductor component, the latter includes at least two optoelectronic semiconductor chips. The semiconductor chips take the form, for example, of light-emitting diodes, LEDs for short, of laser diodes or of super luminescent diodes. The optoelectronic semiconductor component preferably comprises precisely three or precisely four optoelectronic semiconductor chips.

According to at least one embodiment of the optoelectronic semiconductor component, the at least two optoelectronic semiconductor chips are designed to emit electromagnetic radiation in mutually different wavelength ranges when in operation. The optoelectronic semiconductor chips may in this case be differently configured, such that radiation of different wavelengths is generated in active layers of the semiconductor chips. Alternatively or in addition, it is possible for the optoelectronic semiconductor chips each to emit a primary radiation of the same wavelength and for a conversion medium to be arranged downstream of at least one of the semiconductor chips, which conversion medium converts the radiation emitted by this semiconductor chip at least in part into a radiation of a different wavelength.

According to at least one embodiment of the optoelectronic semiconductor component, the latter comprises a carrier with a mounting surface. The carrier is, for example, made of a plastics material and comprises connection means for electrical contacting of the semiconductor chips. Furthermore, the carrier constitutes a unit providing mechanical support for the semiconductor component.

According to at least one embodiment of the optoelectronic semiconductor component, the semiconductor chips are mounted on the mounting surface of the carrier. The carrier is then a common carrier for all the semiconductor chips.

According to at least one embodiment of the optoelectronic semiconductor component, the latter comprises at least two lens bodies. At least one boundary surface of the lens body, in particular at a boundary surface remote from the semiconductor chips, the radiation emitted by the semiconductor chips is refracted. The lens bodies are preferably not rotationally symmetrical. In other words, the lens bodies preferably comprise at most two planes of symmetry relative to which the lens bodies are minor-symmetrical.

According to at least one embodiment of the optoelectronic semiconductor component, the lens bodies are designed to shape the radiation into mutually different emission angles in two mutually orthogonal directions parallel to the mounting surface. In other words, different beam expansion or beam focusing is effected by the lens bodies in the two mutually orthogonal directions. Parallel to the mounting surface may here mean that a plane is defined by the two mutually orthogonal directions, which plane is oriented perpendicularly to the semiconductor component's main emission direction and/or constitutes a tangent plane to the mounting surface. Parallel to the mounting surface thus does not necessarily imply that the mounting surface is planar in shape.

According to at least one embodiment of the optoelectronic semiconductor component, one of the lens bodies is arranged downstream of each of the semiconductor chips in an emission direction. In particular, precisely one of the lens bodies is associated uniquely with each of the semiconductor chips. The emission direction is in particular that direction in which the power emitted by the semiconductor component is at a maximum. Preferably the emission direction is oriented perpendicular to the two mutually orthogonal directions.

In at least one embodiment of the optoelectronic semiconductor component, the latter comprises at least two optoelectronic semiconductor chips, which are designed to emit electromagnetic radiation in mutually different wavelength ranges when in operation. The semiconductor chips are mounted on a mounting surface of a common carrier. Furthermore, the optoelectronic semiconductor component contains at least two non-rotationally symmetrical lens bodies, which are designed to shape the radiation into mutually different emission angles in two mutually orthogonal directions parallel to the mounting surface. One of the lens bodies is here associated with or arranged downstream of each of the semiconductor chips in an emission direction.

Each of the semiconductor chips, preferably emitting in different colors, thus has its own lens arranged downstream in the emission direction. Because each color is thus shaped via its own lens body with regard to its emission characteristics and because the lens bodies are not rotationally symmetrical, a high level of color uniformity of the total radiation emitted by the optoelectronic semiconductor component may be achieved over a wide viewing angle. The emission characteristics may also be differently set in the horizontal and vertical directions. In this way, the semiconductor component may be used in display means or displays in which different emission angles are desired in the vertical and horizontal directions.

According to at least one embodiment of the optoelectronic semiconductor component, the latter takes the form of an "RGB unit." In other words, one of the semiconductor chips emits in the red spectral range, at least one of the semiconductor chips emits in the green spectral range and a further semiconductor chip emits in the blue spectral range. Semiconductor chips which emit radiation of the same color preferably constitute a color channel. Furthermore, each of the semiconductor chips and/or each of the color channels is preferably individually electronically drivable. Due to the drivability of the color channels, a color location (also referred to as chromaticity coordinate) of a total radiation to be emitted by the semiconductor component may in particular be set so as to be variable over time.

According to at least one embodiment of the optoelectronic semiconductor component, the color location of the total radiation emitted by the semiconductor component is varied in an optical far field, depending on the viewing angle, over an angular range of at least 30° by at most 0.02 units of the CIELUV standard chromaticity diagram, preferably by at most 0.005 units. In other words, the color of the total radiation appears uniform and/or constant to the human eye over the angular range of at least 30°, relative to the viewing angle.

In an optical far field here means that the color location is measured at a considerable distance in comparison to lateral dimensions of the semiconductor component or of the lens bodies. Considerable distance may here mean that the distance corresponds to at least ten, preferably at least one hundred times a lateral dimension of the semiconductor component or the lens bodies. If the lens bodies of the semiconductor component extend along the mounting surface, for example, over a distance of 3 mm, the color location is preferably determined at a distance of at least 300 mm.

The fact that the color location varies by at most 0.02 units, preferably by at most 0.005 units, over the angular range may mean that all the color locations in the angular range are located in a region of the CIELUV standard chromaticity diagram which is defined by a circle with a radius of 0.02 units. In other words, the distance in the CIELUV standard chromaticity diagram between two color locations of the radiation in the angular range amounts to at most 0.04 units.

According to at least one embodiment of the optoelectronic semiconductor component, the color location of the total radiation emitted by the semiconductor component varies, depending on the viewing angle, by less than 0.04 units of the standard chromaticity diagram, in particular by less than 0.01 units in a first, in particular horizontal direction of the two mutually orthogonal directions within an angular range of 110°. The color location of the radiation which is emitted by the semiconductor component in the emission direction, i.e. in particular in a direction perpendicular to the carrier, serves in this case as reference for the color location. In other words, a color location deviation of the radiation over the stated angular range, relative to the color location of the radiation in the emission direction, is less than 0.02 units, in particular less than 0.005 units.

According to at least one embodiment of the optoelectronic semiconductor component, the color location varies by less than 0.04 units of the standard chromaticity diagram, preferably by less than 0.01 units in a second, in particular vertical direction of the two mutually orthogonal directions within an angular range of 40°. The color location variation is preferably related in each case to the color location of the radiation in the emission direction. In other words, a color location deviation of the radiation over the stated angular range, relative to the color location of the radiation in the emission direction, is less than 0.02 units, in particular less than 0.005 units.

According to at least one embodiment of the optoelectronic semiconductor component, an aspect ratio of the lens bodies with regard to the mutually orthogonal directions lies between 0.3 and 0.9 inclusive. The aspect ratio preferably lies in the range between 0.35 and 0.6 inclusive. The aspect ratio is in this case the quotient of the maximum extent of the lens body in the second direction and the maximum extent of the lens body in the first direction. The second direction is here in particular the one of the two mutually orthogonal directions in which the emission angle is smaller than with regard to the first direction. An aspect ratio of an angle-dependent intensity distribution preferably lies within corresponding value ranges.

According to at least one embodiment of the optoelectronic semiconductor component, the maximum extents of the lens body in the mutually orthogonal directions amount to at most nine times the maximum dimensions of the semiconductor chip in the corresponding directions. Preferably the maximum extents of the lens body amount to at most eight times, in particular at most seven times, the associated maximum dimensions of the semiconductor chip. If the semiconductor chip, for example, exhibits a length in the first direction of 300 µm, the maximum extent of the lens body in the first direction amounts to at most 2.7 mm, preferably at most 2.4 mm, in particular at most 2.1 mm.

According to at least one embodiment of the optoelectronic semiconductor component, the height of the lens body, in particular in a direction parallel to the emission direction, amounts to between 0.25 times and 0.95 times, inclusive, the maximum extent of the lens body in the two mutually orthogonal directions. The height is preferably between 0.5 times and 0.8 times, inclusive, the maximum extent of the lens body. If, for example, the maximum extent of the lens body in the first direction amounts to 1 mm, the height of the lens body is preferably between 0.25 mm and 0.95 mm inclusive, in particular between 0.5 mm and 0.8 mm inclusive.

According to at least one embodiment of the optoelectronic semiconductor component, adjacent lens bodies are optically isolated from one another with regard to the radiation emitted by the semiconductor chips. In other words, no significant radiation fraction or no radiation fraction generated by one of the semiconductor chips enters one of the lens bodies which is not associated with that semiconductor chip. "No significant" means, for example, that less than 5%, in particular less than 1% of the radiant power of one of the semiconductor chips enters adjacent lens bodies.

According to at least one embodiment of the optoelectronic semiconductor component, the optical isolation between adjacent lens bodies is achieved by a coating on a potting body and/or at least one of the lens bodies. Alternatively, or in addition, the optical isolation may be brought about by a beam dump, which is mounted on the carrier or incorporated into the potting body and/or into at least one of the lens bodies.

According to at least one embodiment of the optoelectronic semiconductor component, the distance between adjacent lens bodies amounts to at least 75 µm, in particular at least 100 µm. The distance between the adjacent lens bodies preferably amounts to at least 5%, preferably at least 10%, of the height of the lens body, in particular in the emission direction. Alternatively, or in addition, the distance amounts to at least 4%, in particular at least 8%, of a maximum extent of the lens body in one of the two mutually orthogonal directions.

According to at least one embodiment of the optoelectronic semiconductor component, a light collection angle of the lens bodies with regard to the radiation emitted by the associated semiconductor chip amounts to at least 145°, preferably at least 160°, in the first direction, and to at least 130°, preferably at least 145°, in the vertical direction. Such light collection angles make it possible for at least 80%, preferably at least 90%, of the radiant power emitted by the semiconductor chip to enter the associated lens bodies.

According to at least one embodiment of the optoelectronic semiconductor component, the lens bodies are each differently shaped. In other words, the optoelectronic semiconductor component does not comprise any two lens bodies which within the bounds of manufacturing tolerances exhibit the same geometry.

According to at least one embodiment of the optoelectronic semiconductor component, at least two of the lens bodies of the optoelectronic semiconductor component exhibit at most one, in particular precisely one plane of symmetry. The plane of symmetry is here preferably a plane of mirror symmetry.

According to at least one embodiment of the optoelectronic semiconductor component, the lens bodies, in plan view of the mounting surface of the carrier, are arranged in a triangular or quadrilateral arrangement. The lens bodies are preferably arranged in an arrangement corresponding to an equilateral triangle, or in a square arrangement. In other words, the lens bodies, and preferably then also the semiconductor components, are arranged at the corners of such a triangle or quadrilateral. It is likewise possible for a further semiconductor chip and the associated lens bodies additionally to be arranged centrally, i.e., in particular at the centroid of the area of the triangle or quadrilateral defined by the other semiconductor chips.

According to at least one embodiment of the optoelectronic semiconductor component, a potting body is located between the lens bodies and the semiconductor chips. The lens bodies are also preferably situated in at least indirect contact with the potting body and are arranged downstream of the potting body in the emission direction. In particular, the potting body completely surrounds the semiconductor chips, with the exception of sides of the semiconductor chips facing the carrier. In other words, the semiconductor chips are then completely enclosed by the carrier and the potting body.

According to at least one embodiment of the optoelectronic semiconductor component, the lens bodies are adhesively bonded, cast or fused onto the potting body. The lens bodies and the potting body are thus, for example, produced differently and mutually independently and only assembled subsequently.

According to at least one embodiment of the optoelectronic semiconductor component, all the lens bodies or, if a potting body is present, all the lens bodies and the potting body are made in one piece and consist of the same material. The potting body and all the lens bodies are, for example, produced by casting, by pressing or by compression moulding in one and the same method step.

According to at least one embodiment of the optoelectronic semiconductor component, the potting body and the lens bodies comprise a silicone, an epoxide or a silicone-epoxide hybrid material or consist thereof.

According to at least one embodiment of the optoelectronic semiconductor component, the latter comprises at least one shield against extraneous radiation. Extraneous radiation is in this case radiation which is not generated by the optoelectronic semiconductor component itself. For example, the extraneous radiation is produced by sunlight. The shield thus in particular prevents directly irradiated sunlight for instance from impinging on the semiconductor chips or on a conversion medium.

According to at least one embodiment of the optoelectronic semiconductor component, a surface shape of at least one or all of the lens bodies, within a z value deviation of at most 10% of a height T of the respective lens body, obeys the following equation:

$$z(x,y)=-0.33866x^2-0.93234y^2-0.54136x^4-1.25032x^2y^2+1.78606y^4+0.50057x^6+1.27170x^4y^2+0.06042x^2y^4-4.44960y^6-0.10344x^8+1.56205x^6y^2+6.38833x^4y^4+2.05268x^2y^6-18.7818y^8-0.158501x^{10}-2.955774x^8y^2-10.73336x^6y^4-26.66134x^4y^6-2.344646x^2y^8+0.127770y^{10}.$$

In other words, the surface shape, i.e., a boundary face of the lens body remote from the carrier, may be described approximately by the stated equation. Approximately may here mean that actual z' values of the surface shape of the lens body, for in each case a given x and y, lie within a range from $z-0.1\,T$ to $z+0.1\,T$, preferably within a range from $z-0.05\,T$ to $z+0.05\,T$, the limits of the range in each case being included. The actual z' values thus deviate from the z values from the stated equation by at most 10% of the height T of the lens body, preferably by at most 5% of the height T. The height T is here the maximum height of the lens body. Scaling of the lens body may take place through selection of a unit length for the coordinates x and y. The unit lengths are preferably of equal value for the coordinates x and y, for example, in each case 1 mm.

According to at least one embodiment of the optoelectronic semiconductor component, the distance between two adjacent lens bodies amounts to at least 10% or at least 15% of a maximum extent of one of the adjacent lens bodies in the same direction.

A display means is additionally provided. The display means comprises at least one of the optoelectronic semiconductor components, as described in conjunction with one or more of the above-stated embodiments. Features of the optoelectronic semiconductor component are, therefore, also disclosed for the display means described herein and vice versa.

According to at least one embodiment of the display means, the latter comprises a plurality of pixels. The display means, for example, constitutes a display.

According to at least one embodiment of the display means, each of the pixels is formed by an optoelectronic semiconductor component according to one of the preceding embodiments.

According to at least one embodiment of the display means, a distance between adjacent pixels amounts to between 4 mm and 75 mm inclusive, preferably between 8 mm and 50 mm inclusive, in particular between 12 mm and 23 mm inclusive.

According to at least one embodiment of the display means, the pixels are arranged in rows and columns in the manner of a matrix. Furthermore, each of the pixels is preferably individually drivable.

According to at least one embodiment of the display means, the latter has no mask. A mask is in this case in particular a device which is designed to effect color filtering of the radiation generated in the pixels as a function of time. In particular, the display means has no liquid crystal mask, or LCD mask for short.

An optoelectronic semiconductor component described herein and a display means described herein will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

BRIEF DESCRIPTION OF THE DRAWINGS

In the drawings:

FIG. 1, which includes FIGS. 1A-1D, is a schematic representation of an exemplary embodiment of an optoelectronic semiconductor component described herein, FIG. 2, which includes FIGS. 2A and 2B, is a schematic representation of an angle-dependent intensity distribution (A) and an angle-dependent color location distribution (B) of one exemplary embodiment of a semiconductor component described herein, FIGS. 3 to 8, which include FIGS. 3A and 3B, 4, 5, 6A and 6B, 7A-7C and 8A-8D, are schematic representations of further exemplary embodiments of semiconductor components described herein, and FIG. 9 is a schematic representation of an exemplary embodiment of a display means described herein.

DETAILED DESCRIPTION OF ILLUSTRATIVE EMBODIMENTS

Figure 7:
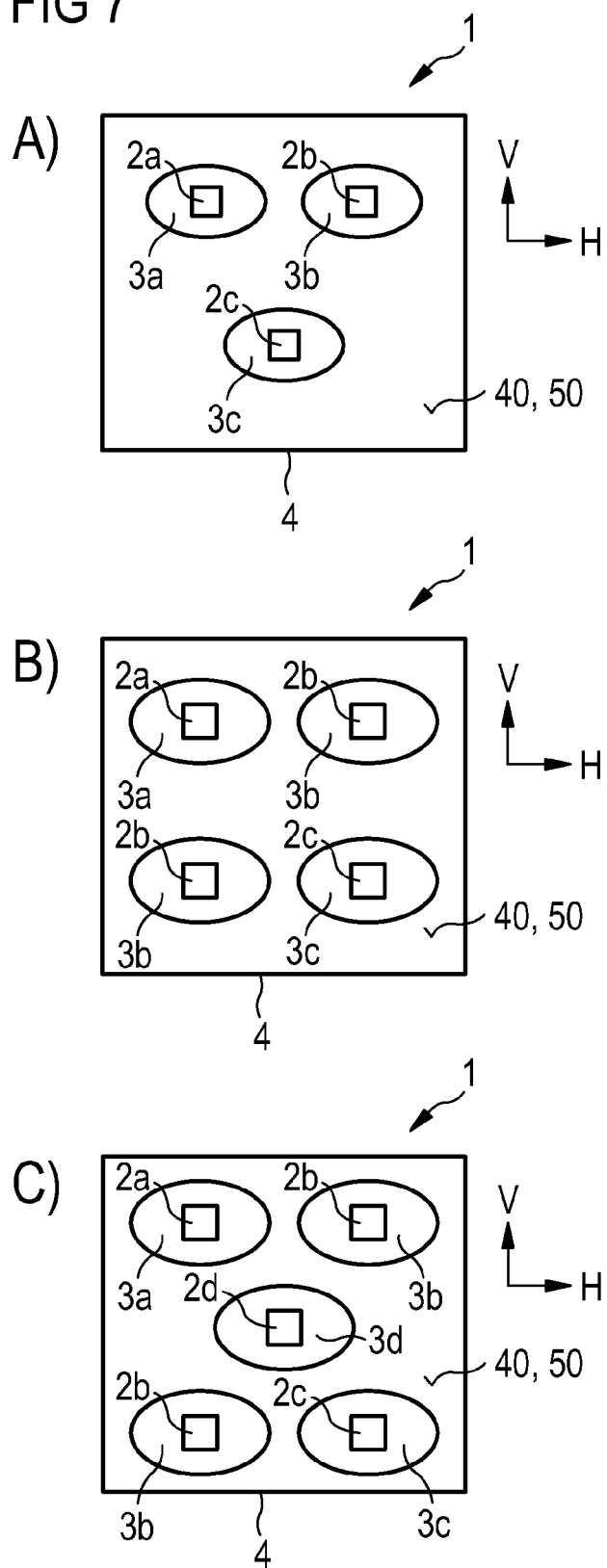

FIG. 1 shows an exemplary embodiment of an optoelectronic semiconductor component 1, and includes the three-dimensional representation in FIG. 1A, the front view in FIG. 1B, the side view in FIG. 1C and the plan view in FIG. 1D. The semiconductor component 1 comprises a carrier 4 with a mounting surface 40. Three semiconductor chips 2a-c are mounted on the mounting surface 40. Electrical contacting of the semiconductor chips 2a-c proceeds via electrical connection means of the carrier 4, not shown in FIG. 1. Each of the semiconductor chips 2a-c emits in a different spectral range. For example, the semiconductor chip 2a emits red light, the semiconductor chip 2b green light and the semiconductor chip 2c blue light. Furthermore, the semiconductor chips 2a-c are separately electrically drivable, such that the color location of the radiation generated by the semiconductor component 1 may be adjusted.

A recess 7 in the carrier 4, in which the semiconductor chips 2a-c and the mounting surface 40 are located, is filled and covered by a potting body 5. The potting body 5 completely surrounds the semiconductor chips 2a-c, together with the carrier 4. Unlike what is shown in FIG. 1, the semiconductor component 1 may also be free of a potting body. In this case, the semiconductor chips 2a-c are preferably completely enclosed by lens bodies 3a-c and the carrier 4. The potting body 5 constitutes a type of pedestal for the lens bodies 3a-c.

A recess 7 in the carrier 4 may be provided with at least one reflective, absorbent or colored layer. The appearance and/or optical characteristics of the semiconductor component 1 may be purposefully adjusted by means of this layer on the recess 7 or indeed on the entire carrier 4 or only on the mounting surface 40.

The three lens bodies 3a-c are located on the top 50 of the potting body 5 remote from the carrier 4. The lens bodies 3a-c and the potting body 5 are made in one piece and consist of the same material, for example, a silicone, an epoxide or a silicone-epoxide hybrid material. Precisely one of the lens bodies 3a-c is uniquely associated with each of the semiconductor chips 2a-c. The lens bodies 3a-c exhibit different dimensions and curvatures in a horizontal direction H and in a vertical direction V. The horizontal direction H and the vertical direction V in particular define a tangent plane to the mounting surface 40, which is preferably oriented perpendicular to an emission direction z. The emission direction z is in particular a main emission direction of the semiconductor component 1, in which a maximum radiant power is emitted.

The lens bodies 3a-c are in particular not rotationally symmetrical with regard to the emission direction z. The emission characteristics in the horizontal direction H may in this way be set to be different from the emission characteristics in the vertical direction V. For example, a surface shape of the lens bodies 3a-c obeys the following equation:

$$z(x,y) = -0.33866x^2 - 0.93234y^2 - 0.54136x^4 - 1.25032x^2y^2 + 1.78606y^4 + 0.50057x^6 + 1.27170x^4y^2 + 0.06042x^2y^4 - 4.44960y^6 - 0.10344x^8 + 1.56205x^6y^2 + 6.38833x^4y^4 + 2.05268x^2y^6 - 18.7818y^8 - 0.158501x^{10} - 2.955774x^8y^2 - 10.73336x^6y^4 - 26.66134x^4y^6 - 2.344646x^2y^8 + 0.127770y^{10}.$$

x, y and z are here unit-less numbers. An x axis is oriented parallel to the horizontal direction H and a y axis parallel to the vertical direction V. The x and y axes, relative to the respective lens bodies, intersect in the xy plane in particular at the point where z is maximum for the respective lens bodies 3a-c.

In the form of contour lines, FIG. 2A shows an intensity distribution of a total radiation emitted for instance by the optoelectronic semiconductor component 1 according to FIG. 1 as a function of an emission angle $\alpha_H$ in the horizontal direction H and of an emission angle $\alpha_V$ in the vertical direction V.

A maximum radiant power is emitted in the emission direction z, i.e., for $\alpha_H = \alpha_V = 0$. This radiant power in the emission direction z is normalized to one. According to FIG. 2A the total radiation is emitted differently in terms of the vertical direction V and the horizontal direction H. In the vertical direction V an angle-dependent radiant power of at least 6% of the radiant power in the emission direction z is emitted within an angular range of around −40° to +40°, thus over an angular range of overall around 80°. In the horizontal direction H this applies to angles of between around −80° and +80°, i.e., over a total angular range of approx. 160°.

FIG. 2B shows a corresponding representation regarding the color location of the total radiation emitted by the semiconductor component 1 in the optical far field. Far field here means that the distance at which the color location is determined as a function of angle is markedly greater than lateral dimensions of the lens bodies 3a-c. Within an outline the maximum deviation of the color location of the radiation emitted over the various angles, relative to the radiation in the emission direction or the main emission direction, amounts to at most 0.020 units in the CIELUV standard chromaticity diagram. The color location deviation according to FIG. 2B is thus related to the color location of the radiation for $\alpha_H = \alpha_V = 0$, the deviation, therefore, being 0.000 for $\alpha_H = \alpha_V = 0$. In other words, all the color locations of the total radiation within the outline shown in FIG. 2B thus exhibit a distance from one another in the CIELUV standard chromaticity diagram of at most 0.040 units. Within the outlined angular range the radiation thus appears of identical color to the human eye, irrespective of viewing angle. A color location of the total radiation of the semiconductor component 1 is in other words in the angular range within the outline largely irrespective of the viewing angle.

Regarding the emission angle $\alpha_V$ in the vertical direction V the color location is approximately constant within an angular range of around −40° to around +40°, i.e., over an angular range of approx. 80°. In the horizontal direction H regarding the emission angle $\alpha_H$ this uniformity is achieved over virtually the entire half plane, i.e., from approximately −85° to approximately +85°.

In the exemplary embodiment of the semiconductor component 1 according to FIG. 3, a beam dump 8 is mounted between the adjacent lens bodies 3b, 3c. The beam dump 8 consists, for example, of a radiation-absorbing, opaque material. The beam dump 8 may be part of the carrier 4 or introduced as a separate component into the potting body 5. Unlike what is shown in FIG. 3A, the beam dump 8 may optionally extend as far as the top 50 of the potting body 5.

Beam paths R1, R2 of the radiation generated by the semiconductor chip 2b are shown symbolically by lines with arrows. Total reflection may take place at the top 50 of the potting body 5 and the radiation which is generated by the semiconductor chip 2b, may in this way arrive at the adjacent lens body 3c.

According to FIG. 3B a coating 9 is applied to the top 50 of the potting body 5 in regions which are not covered by the lens bodies 3b, 3c. The coating 9 preferably has an absorbent action with regard to the radiation generated by the semiconductor chip 2b. If the coating 9 is applied to the top 50, the beam dump 8 may optionally be omitted.

Unlike what is shown in FIG. 3B, a plurality of coatings 9 may also be applied over one another on the top 50 of the potting body 5. A first coating facing the semiconductor chip 2b is, for example, absorbent and a second coating on the top 50 and remote from the semiconductor chip 2b may be colored, white or black.

According to FIG. 4 the adjacent lens bodies 3 are spaced from one another by a distance w, which amounts, for example, to at least 100 µm. The distance w is preferably sufficiently large for none of the radiation generated by the semiconductor chip 2a and arriving at the associated lens body 3a to impinge on the adjacent lens body 3b. Thus, none or almost none of the radiation generated by the semiconductor chip 2a is influenced by the lens body 3b for instance by reflection or refraction.

In the exemplary embodiment according to FIG. 5 the lens bodies 3 have a light collection angle β of around 150° in the vertical direction V. A light collection angle in the horizontal direction H is preferably at least 160°. In this way a large proportion of the radiant power emitted by the semiconductor chip 2 reaches the lens bodies 3, for example, more than 90%. Thus almost all the radiation emitted by the semiconductor chip 2a is projected by the lens body 3a or shaped into an emission profile corresponding to the shape of the lens body 3a.

FIG. 6 shows an exemplary embodiment of the optoelectronic component 1, in which the three lens bodies 3a-c each have mutually different geometric shapes, see the schematic sectional representation in FIG. 6A and the plan view in FIG. 6B. In particular, the three lens bodies 3a-c exhibit different heights T1-3 in the emission direction z. The lens body 3b has two planes of symmetry, which are defined by the emission direction z and the vertical direction V and by the emission direction z and the horizontal direction H. The lens bodies 3a, 3c each have just one plane of symmetry, which is defined by the vertical direction V and the emission direction z.

The three semiconductor chips 2a-c each have different heights in the emission direction z. This may be compensated by the likewise different heights T1-3 of the lens bodies 3a-c, such that the radiation emitted by each of the semiconductor chips 2a-c is emitted in the same or in comparable manner.

The distance w between the adjacent lens bodies 3a-c amounts, for example, to at least 10% of the maximum extent L1 in the vertical direction V of the lens body 3b. The heights T1-3 of the respective lens bodies 3a-c are in each case preferably between 0.25 times and 0.95 times, inclusive, the associated maximum dimension L2 of the lens body 3b in the horizontal direction H. An aspect ratio, defined by the quotient of the maximum dimensions L1, L2 is preferably between 0.3 and 0.95 inclusive. Furthermore, the maximum extents L1, L2 of the lens bodies 3a-c amount in particular to at most six times the associated maximum dimensions C1, C2 of the semiconductor chips 2a-c.

The maximum extent L2 in the horizontal direction H is, for example, between 1 mm and 2 mm inclusive, while the maximum dimension L1 of the lens body 3 in the vertical direction is, for example, between 0.5 mm and 1.5 mm inclusive. The height T2 is preferably less than or equal to 1 mm. Lateral dimensions of the entire semiconductor component 1 amount, for example, to between 1.5 mm×1.5 mm and 6 mm×6 mm, in particular around 3 mm×3 mm.

According to FIGS. 7A, 7B and 7C the lens bodies 3a-c and the semiconductor chips 2a-c are arranged in a triangular arrangement or in a square arrangement, when the carrier 4 is viewed in plan view. According to FIG. 7B the semiconductor component 1 comprises four semiconductor chips 2a-c and four lens bodies 3a-c. The semiconductor chips 2b, for example, emit in the green spectral range, the semiconductor chip 2a in the red and the semiconductor chip 2c in the blue spectral range. The semiconductor component 1 according to FIG. 7B is thus an "RGGB unit". According to FIG. 7C, a semiconductor chip 2d and a lens body 3d are additionally arranged in the centroid of the area of the quadrilateral defined by the semiconductor chips 2a-c and by the lens bodies 3a-c.

In the exemplary embodiments according to FIG. 8 the optoelectronic semiconductor components 1 each comprise at least one shield 6 against extraneous radiation. The extraneous radiation is produced, for example, by direct solar radiation.

According to FIG. 8A the semiconductor component 1 comprises precisely one shield 6, which is mounted on the carrier 4 separately from the lens bodies 3. According to FIG. 8B a shield 6a, 6b is associated with each of the lens bodies 3a, 3b. In the case of the semiconductor component 1 according to FIG. 8C the shields 6a, 6b are adapted to or moulded onto the lens bodies 3a, 3b. It is likewise possible for the shields 6a, 6b to be surrounded by the lens bodies 3a, 3b or incorporated therein. According to the plan view in FIG. 8D the shield 6 has an elongated, curved outline.

FIG. 9 shows an exemplary embodiment of a display means 10. A plurality of optoelectronic semiconductor components 1, fashioned, for example, according to one of FIGS. 1 and 3 to 8, are mounted in a matrix-like two-dimensional arrangement. Pixels of the display means 10 are produced by the semiconductor components 1. The distance D between adjacent pixels and thus between adjacent semiconductor components 1 amounts, for example, to between 12 mm and 23 mm inclusive. The display means 10 is in particular designed to display colored images and/or films.

In conventional display means semiconductor components are used, for example, in which a single lens is arranged downstream of a plurality of chips on a common mounting support. In this way, radiation generated by the chips, in particular in different colors, is refracted differently by the lens, since the chips are, for example, situated at different positions relative to an optical axis of the lens. In such an arrangement, in which a plurality of chips are covered by a single lens, the color uniformity achievable is limited with regard to an emission angle. Depending on the viewing angle, different color appearances may in this way arise.

Furthermore conventional display means may comprise light-emitting diodes, downstream of which in the emission direction there is arranged no or just one radially symmetrical lens. Emission then likewise typically proceeds rotationally symmetrically in a light cone with an opening angle of around 120°. For display means this emission angle is too large, especially in the vertical direction. The radiant intensity in the desired angular range, for example, 110° in the horizontal direction and 40° in the vertical direction, is thereby reduced.

Furthermore, conventional display means have "radial LEDs." When mounting radial LEDs, comparatively large tolerances arise in terms of the angle of the radial LED to a mounting support. In this way a type of squint, or "dithering effect," may arise. Such an effect is undesirable in particular for video displays.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor component comprising:
   a carrier;
   at least two optoelectronic semiconductor chips which are designed to emit electromagnetic radiation in mutually different wavelength ranges when in operation and which are mounted on a mounting surface of the carrier; and
   at least two non-rotationally symmetrical lens bodies which are designed to shape the radiation into mutually different emission angles in two mutually orthogonal directions parallel to the mounting surface,
   wherein one of the lens bodies is arranged downstream of each of the semiconductor chips in an emission direction, and
   wherein a surface shape of at least one or all of the lens bodies, within a z value deviation of at most 10% of a height of the respective lens body, obeys the following equation:

$z(x,y) = -0.33866x^2 - 0.93234y^2 - 0.54136x^4 - 1.25032x^2y^2 + 1.78606y^4 + 0.50057x^6 + 1.27170x^4y^2 + 0.06042x^2y^4 - 4.44960y^6 - 0.10344x^8 + 1.56205x^6y^2 + 6.38833x^4y^4 + 2.05268x^2y^6 - 18.7818y^8 - 0.158501x^{10} - 2.955774x^8y^2 - 10.73336x^6y^4 - 26.66134x^4y^6 - 2.344646x^2y^8 + 0.127770y^{10}$.

2. The optoelectronic semiconductor component according to claim 1, wherein an aspect ratio of the lens bodies with regard to the mutually orthogonal directions lies between 0.3 and 0.9 inclusive.

3. The optoelectronic semiconductor component according to claim 1, wherein maximum extents of the lens bodies in the mutually orthogonal directions amount to at most nine times maximum dimensions of the semiconductor chips in corresponding directions.

4. The optoelectronic semiconductor component according to claim 1, wherein the height of the lens bodies is between 0.25 times and 0.95 times, inclusive, a maximum extent of the lens bodies in the mutually orthogonal directions.

5. The optoelectronic semiconductor component according to claim 1, wherein adjacent lens bodies are optically isolated from one another with regard to the radiation emitted by the semiconductor chips.

6. The optoelectronic semiconductor component according to claim 1, wherein a light collection angle of the lens bodies with regard to the radiation emitted by the semiconductor chips amount to at least 145° in a horizontal direction and to at least 130° in a vertical direction.

7. The optoelectronic semiconductor component according to claim 1, wherein each lens body has a different shape than the other lens bodies.

8. The optoelectronic semiconductor component according to claim 1, wherein the lens bodies, in plan view of the mounting surface, are arranged in a triangular arrangement.

9. The optoelectronic semiconductor component according to claim 1, further comprising a potting body located between the lens bodies and the semiconductor chips, wherein, when viewed in the emission direction, the lens bodies are located on the potting body.

10. The optoelectronic semiconductor component according to claim 9, wherein all the lens bodies or wherein all the lens bodies and the potting body are made in one piece and comprise the same material.

11. The optoelectronic semiconductor component according to claim 1, further comprising at least one shield against extraneous radiation.

12. A display device with a plurality of pixels, wherein
    at least one of the pixels is formed by the optoelectronic semiconductor component according to claim 1, and
    a distance between adjacent pixels amounts to between 4 mm and 75 mm inclusive.

13. The optoelectronic semiconductor component according to claim 1, wherein the lens bodies, in plan view of the mounting surface, are arranged in a quadrilateral arrangement.

14. The optoelectronic semiconductor component according to claim 1, wherein the lens bodies, in plan view of the mounting surface, are arranged in a quadrilateral arrangement in which the arrangement comprises a further central lens body.

* * * * *

UNITED STATES PATENT AND TRADEMARK OFFICE
CERTIFICATE OF CORRECTION

PATENT NO. : 8,698,385 B2
APPLICATION NO. : 13/202252
DATED : April 15, 2014
INVENTOR(S) : Peter Brick It is certified that error appears in the above-identified patent and that said Letters Patent is hereby corrected as shown below:

On the Title Page, Item (73) Assignee, line 1, delete "OSRAM Opto Semiconductor GmbH," and insert --OSRAM Opto Semiconductors GmbH,--.

Signed and Sealed this
Twenty-sixth Day of July, 2016

Michelle K. Lee
*Director of the United States Patent and Trademark Office*